(12) United States Patent
Jin

(10) Patent No.: US 12,696,557 B2
(45) Date of Patent: Jul. 28, 2026

(54) IMAGE SENSOR INCLUDING VERTICAL GATE ELECTRODE AT CENTER OF PIXEL REGION AND CHARGE POCKET REGION UNDER VERTICAL GATE ELECTRODE

(71) Applicant: SAMSUNG ELECTRONICS CO., LTD., Suwon-si (KR)

(72) Inventor: Younggu Jin, Osan-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 558 days.

(21) Appl. No.: 18/103,670

(22) Filed: Jan. 31, 2023

(65) Prior Publication Data
US 2023/0317742 A1 Oct. 5, 2023

(30) Foreign Application Priority Data
Mar. 18, 2022 (KR) ........................ 10-2022-0033803

(51) Int. Cl.
*H10F 39/00* (2025.01)
*H10F 39/18* (2025.01)
(52) U.S. Cl.
CPC ........... *H10F 39/802* (2025.01); *H10F 39/18* (2025.01); *H10F 39/8037* (2025.01); *H10F 39/8063* (2025.01); *H10F 39/807* (2025.01)
(58) Field of Classification Search
CPC .... H10F 39/802; H10F 39/18; H10F 39/8037; H10F 39/8063; H10F 39/807;
(Continued)

(56) References Cited

U.S. PATENT DOCUMENTS 7,626,685 B2 12/2009 Jin et al.
9,240,512 B2 1/2016 Kim et al.
(Continued)

FOREIGN PATENT DOCUMENTS

KR 10-2009-0127828 A 12/2009
KR 10-2015-0050029 A 5/2015
(Continued)

OTHER PUBLICATIONS

Richardson, J., A., et al., "Low Dark Count Single-Photon Avalanche Diode Structure Compatible With Standard Nanometer Scale CMOS Technology" IEEE Photonics Technology Letters, vol. 21, No. 14, Jul. 15, 2009, pp. 1020-1022, 3 pages.
(Continued)

*Primary Examiner* — Ratisha Mehta
*Assistant Examiner* — Sophia W Kao
(74) *Attorney, Agent, or Firm* — Sughrue Mion, PLLC

(57) ABSTRACT
An image sensor includes a semiconductor substrate including a pixel region; a vertical gate electrode disposed in the semiconductor substrate at a center of the pixel region; a charge pocket region provided under the vertical gate electrode in the semiconductor substrate, and doped with a first impurity having a first conductivity type; a first impurity region which is spaced apart from the charge pocket region in a vertical direction, doped with a second impurity having a second conductivity type, and surrounded by the vertical gate electrode; and a second impurity region which is provided around the vertical gate electrode and doped with the second impurity.

8 Claims, 21 Drawing Sheets

(58) Field of Classification Search
CPC ............. H10F 39/199; H10F 39/80373; G01S
7/4863; G01S 17/894
See application file for complete search history.

(56) References Cited

U.S. PATENT DOCUMENTS

| | | |
|---|---|---|
| 9,406,714 B2 | 8/2016 | Jung et al. |
| 10,312,275 B2 | 6/2019 | Hynecek |
| 10,388,682 B2 | 8/2019 | Jin |
| 2014/0103413 A1* | 4/2014 | Jin ......................... H04N 25/76 |
| | | 257/292 |
| 2014/0104942 A1 | 4/2014 | Jin et al. |
| 2016/0005777 A1* | 1/2016 | Nakamura ............ H10F 39/806 |
| | | 257/229 |
| 2016/0218138 A1* | 7/2016 | Oishi .................... H10F 39/812 |
| 2017/0236858 A1 | 8/2017 | Oh et al. |
| 2019/0068908 A1 | 2/2019 | Kobayashi et al. |
| 2020/0381465 A1 | 12/2020 | Lin et al. |
| 2021/0118925 A1 | 4/2021 | Zang et al. |

FOREIGN PATENT DOCUMENTS

| | | |
|---|---|---|
| KR | 10-2016-0091244 A | 8/2016 |
| KR | 10-2101839 B1 | 4/2020 |
| KR | 10-1797288 B1 | 11/2021 |
| KR | 10-2021-0150744 A | 12/2021 |

OTHER PUBLICATIONS

Lu, G., et al., "1T Pixel Using Floating-Body MOSFET for CMOS
Image Sensors", Sensors, (9), 2009, pp. 131-147; doi:10.3390/
s90100131, 18 pages.

* cited by examiner

W1

PR          PIS          PR

A          A

PIS

S1

S4

103
105

S2

121    123    PR          S3    PR

D2

D3    D1

PR      PIS      PR

PIS

S1

S4

S2

103

105

121   123   PR      S3   PR

D2

D3  → D1

PR       PIS       PR

P1

P2

P1

PIS

|        | Reset | Integration | Readout |
|--------|-------|-------------|---------|
| $V_D$  | 0V    | 0V          | 0V      |
| $V_G$  | ≤0V   | ≥1V         | ≤-0.5V  |
| $V_S$  | ≥1V   | 0V          | Output  |

FIG. 8B

|        | Reset | Integration | Readout |
|--------|-------|-------------|---------|
| $V_D$  | Vdd   | Vdd         | Vdd     |
| $V_G$  | Vdd   | 0V          | ≥0.5V   |
| $V_S$  | ≤Vdd  | Vdd         | Output  |

PR     Pb PIS     PR

125

131
133

131
133

Pa
PIS

| | Reset | Integration | Readout |
|---|---|---|---|
| $V_{D1}$ | 0V | 0V | 0V |
| $V_G$ | $\leq$ 0V | $\geq$ 0V | $\leq$ -0.5V |
| $V_S$ | 0V | 0V | Output |
| $V_{RG}$ | $\geq$ 1V | $\leq$ 0V | $\leq$ 0V |
| $V_{D2}$ | Vdd | Vdd | Vdd |

FIG. 15B

| | Reset | Integration | Readout |
|---|---|---|---|
| $V_{D1}$ | Vdd | Vdd | Vdd |
| $V_G$ | Vdd | 0V | > 0.5V |
| $V_S$ | Vdd | Vdd | Output |
| $V_{RG}$ | $\leq$ 1V | $\geq$ 1V | $\geq$ 1V |
| $V_{D2}$ | $\leq$ 0V | $\leq$ 0V | $\leq$ 0V |

IMAGE SENSOR INCLUDING VERTICAL GATE ELECTRODE AT CENTER OF PIXEL REGION AND CHARGE POCKET REGION UNDER VERTICAL GATE ELECTRODE

CROSS-REFERENCE TO RELATED APPLICATIONS

This U.S. non-provisional patent application is based on and claims priority under 35 U.S.C. § 119 to Korean Patent Application No. 10-2022-0033803, filed on Mar. 18, 2022, in the Korean Intellectual Property Office, the disclosure of which is incorporated by reference herein in its entirety.

BACKGROUND

The disclosure relates to an image sensor, and more particularly, to an image sensor capable of photon counting at a low voltage.

An image sensor is an electronic device that converts an optical image into an electrical signal. Recently, with developments in the computer industry and the communication industry, demand for an image sensor with improved performance in various fields such as digital cameras, camcorders, personal communication systems (PCS), game devices, security cameras, and medical micro cameras has increased. Furthermore, recently, image sensors for realizing a three-dimensional image as well as a color image have been developed, for example distance sensors using Time-of-Flight (ToF).

SUMMARY

Provided is an image sensor that is capable of operating at a low voltage and is advantageous for miniaturization.

Objectives solved by the disclosure are not limited to the above-described objectives, and other objectives, which are not described above, may be clearly understood by those skilled in the art through the following specification. Additional aspects will be set forth in part in the description which follows and, in part, will be apparent from the description, or may be learned by practice of the presented embodiments.

In accordance with an aspect of the disclosure, an image sensor includes a semiconductor substrate including a pixel region; a vertical gate electrode disposed in the semiconductor substrate at a center of the pixel region; a charge pocket region provided under the vertical gate electrode in the semiconductor substrate, and doped with a first impurity having a first conductivity type; a first impurity region which is spaced apart from the charge pocket region in a vertical direction, doped with a second impurity having a second conductivity type, and surrounded by the vertical gate electrode; and a second impurity region which is provided around the vertical gate electrode and doped with the second impurity.

In accordance with an aspect of the disclosure, an image sensor includes a semiconductor substrate including a plurality of pixel regions; a pixel isolation structure which is provided in the semiconductor substrate and defines each pixel region of the plurality of pixel regions; a vertical gate electrode disposed in the each pixel region; a charge pocket region which is provided under the vertical gate electrode in the each pixel region and doped with a first impurity having a first conductivity type; a first impurity region which is spaced apart from the charge pocket region in a vertical direction in the each pixel region, doped with a second impurity having a second conductivity type, and surrounded by the vertical gate electrode; a second impurity region which is provided around the vertical gate electrode in the each pixel region and doped with the second impurity; and a plurality of micro-lenses, wherein each micro-lens of the plurality of micro-lenses is disposed on a first surface of the semiconductor substrate and provided in a corresponding pixel region of the plurality of pixel regions.

In accordance with an aspect of the disclosure, an image sensor includes a semiconductor substrate including a pixel region, wherein the pixel region includes a pixel transistor including a vertical gate electrode, a source region, and a drain region; and a charge pocket region provided under the vertical gate electrode in the semiconductor substrate, wherein the source region is spaced apart from the charge pocket region in a vertical direction and surrounded by the vertical gate electrode, and wherein the drain region is provided around the vertical gate electrode.

BRIEF DESCRIPTION OF THE DRAWINGS

The above and other aspects, features, and advantages of certain embodiments of the present disclosure will be more apparent from the following description taken in conjunction with the accompanying drawings, in which:

FIGS. 8A and 8B are voltage condition tables for explaining operations of image sensors according to embodiments;

FIGS. 15A and 15B are voltage condition tables for explaining operations of image sensors according to embodiments;

DETAILED DESCRIPTION

Figure 1:
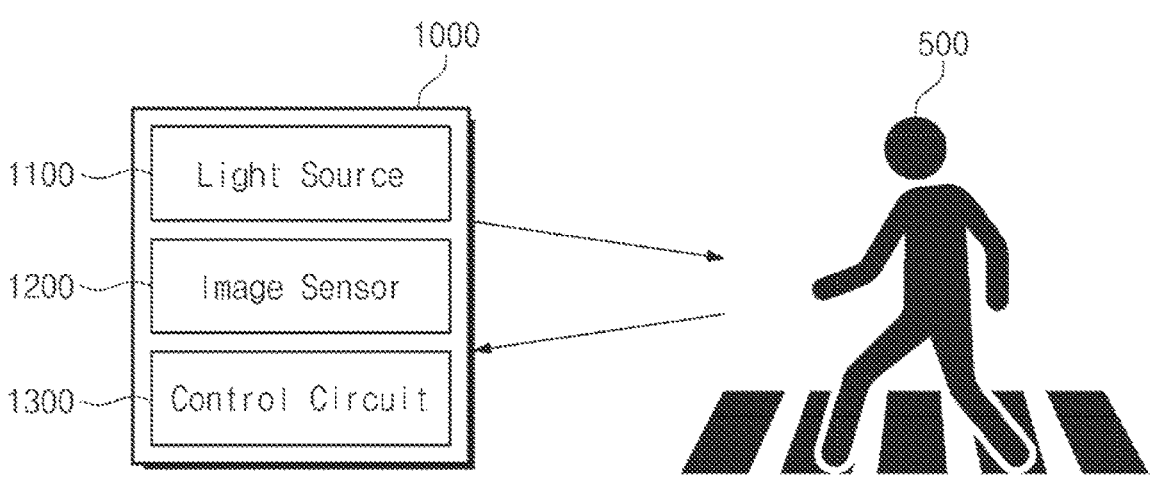
FIG. 1 is a diagram schematically illustrating an image sensor system according to an embodiment.

Hereinafter, an image sensor according to embodiments will be described in detail with reference to the drawings.

As is traditional in the field, the embodiments are described, and illustrated in the drawings, in terms of functional blocks, units and/or modules. Those skilled in the art will appreciate that these blocks, units and/or modules are physically implemented by electronic (or optical) circuits such as logic circuits, discrete components, microprocessors, hard-wired circuits, memory elements, wiring connections, and the like, which may be formed using semiconductor-based fabrication techniques or other manufacturing technologies. In the case of the blocks, units and/or modules being implemented by microprocessors or similar, they may be programmed using software (e.g., microcode) to perform various functions discussed herein and may optionally be driven by firmware and/or software. In embodiments, each block, unit and/or module may be implemented by dedicated hardware, or as a combination of dedicated hardware to perform some functions and a processor (e.g., one or more programmed microprocessors and associated circuitry) to perform other functions. Also, each block, unit and/or module of the embodiments may be physically separated into two or more interacting and discrete blocks, units and/or modules without departing from the present scope. Further, the blocks, units and/or modules of the embodiments may be physically combined into more complex blocks, units and/or modules without departing from the present scope.

FIG. 1 is a diagram schematically illustrating an image sensor system according to an embodiment.

Referring to FIG. 1, an image sensor system 1000 according to embodiments may irradiate a light to an object 500 and detect the light reflected from the object 500, thereby detecting an optical depth or distance of the object 500. The image sensor system 1000 may include a light source 1100 irradiating light to the target object 500, an image sensor 1200 sensing light reflected from the object 500, and a control circuit 1300.

The light source 1100 irradiates an optical signal in a form of a pulse to the object 500. For example, infrared rays, microwaves, light waves, or ultrasonic waves may be used as the light source 1100. According to an embodiment, a light emitting diode (LED), a laser diode (LD), or an organic light emitting diode (OLED) may be used as the light source 1100.

The image sensor 1200 may detect light reflected from the object 500 and output optical depth information about the object 500.

The optical depth information obtained from the image sensor 1200 may be used to implement a three-dimensional image such as an infrared camera. In addition, a three-dimensional color image may be implemented by using the image sensor 1200 including depth pixels and visible light pixels.

The control circuit 1300 may control the light source 1100 and the image sensor 1200. The control circuit 1300 may synchronize the light source 1100 and the image sensor 1200 with each other and transmit control signals for controlling the light source 1100 and the image sensor 1200 to the light source 1100 and the image sensor 1200, based on the same clock signal. The control circuit 1300 may include a clock generator that generates a clock signal.

Figure 2:
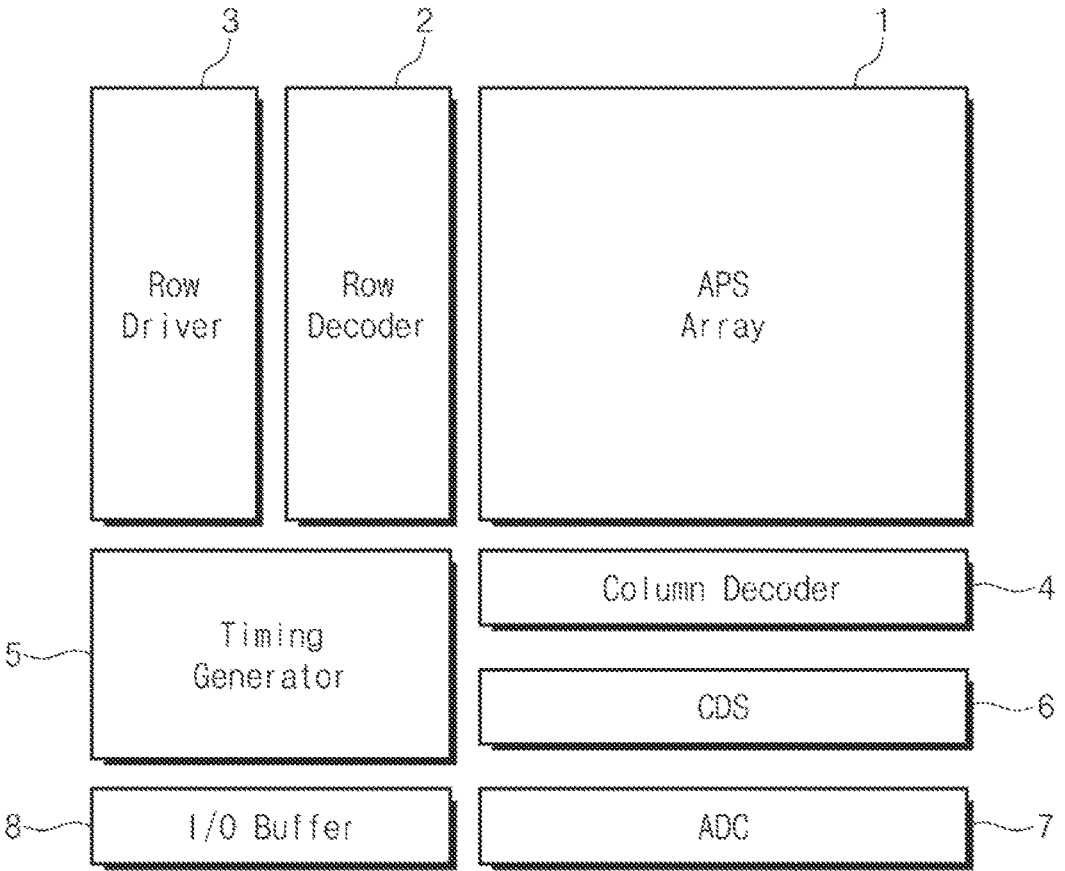
FIG. 2 is a block diagram of an image sensor according to an embodiment.

FIG. 2 is a block diagram of an image sensor according to embodiments.

Referring to FIG. 2, an image sensor includes an active pixel sensor array 1, a row decoder 2, a row driver 3, a column decoder 4, a timing generator 5, a correlated double sampler (CDS) 6, an analog-to-digital converter (ADC) 7, and an input/output (I/O) buffer 8.

The active pixel sensor array 1 includes a plurality of two-dimensionally arranged unit pixels and converts an optical signal into an electrical signal. Each unit pixel may include one photodetector and a pixel transistor.

The row driver 3 provides a plurality of driving signals for driving the plurality of unit pixels to the active pixel sensor array 1 in response to a result decoded by the row decoder 2. When the unit pixels are arranged in a matrix form, the driving signals may be provided for each row.

The timing generator 5 provides a timing signal and a control signal to the row decoder 2 and the column decoder 4.

The correlated double sampler (CDS) 6 receives, holds, and samples an electrical signal generated by the active pixel sensor array 1. The correlated double sampler 6 doubly samples a specific noise level and a signal level by an electrical signal, and outputs a difference level corresponding to a difference between the noise level and the signal level.

The analog-to-digital converter (ADC) 7 converts the analog signal corresponding to the difference level output from the correlated double sampler 6 into a digital signal and outputs the digital signal. When a pixel capable of single photon counting is used, the analog-to-digital converter 7 may be omitted or an analog-to-digital converter (ADC) having a low bit resolution may be used.

The input/output buffer 8 latches a digital signal, and the latched signal sequentially outputs a digital signal to an image signal processing unit (not shown) in response to a decoding result in the column decoder 4.

Figure 3:
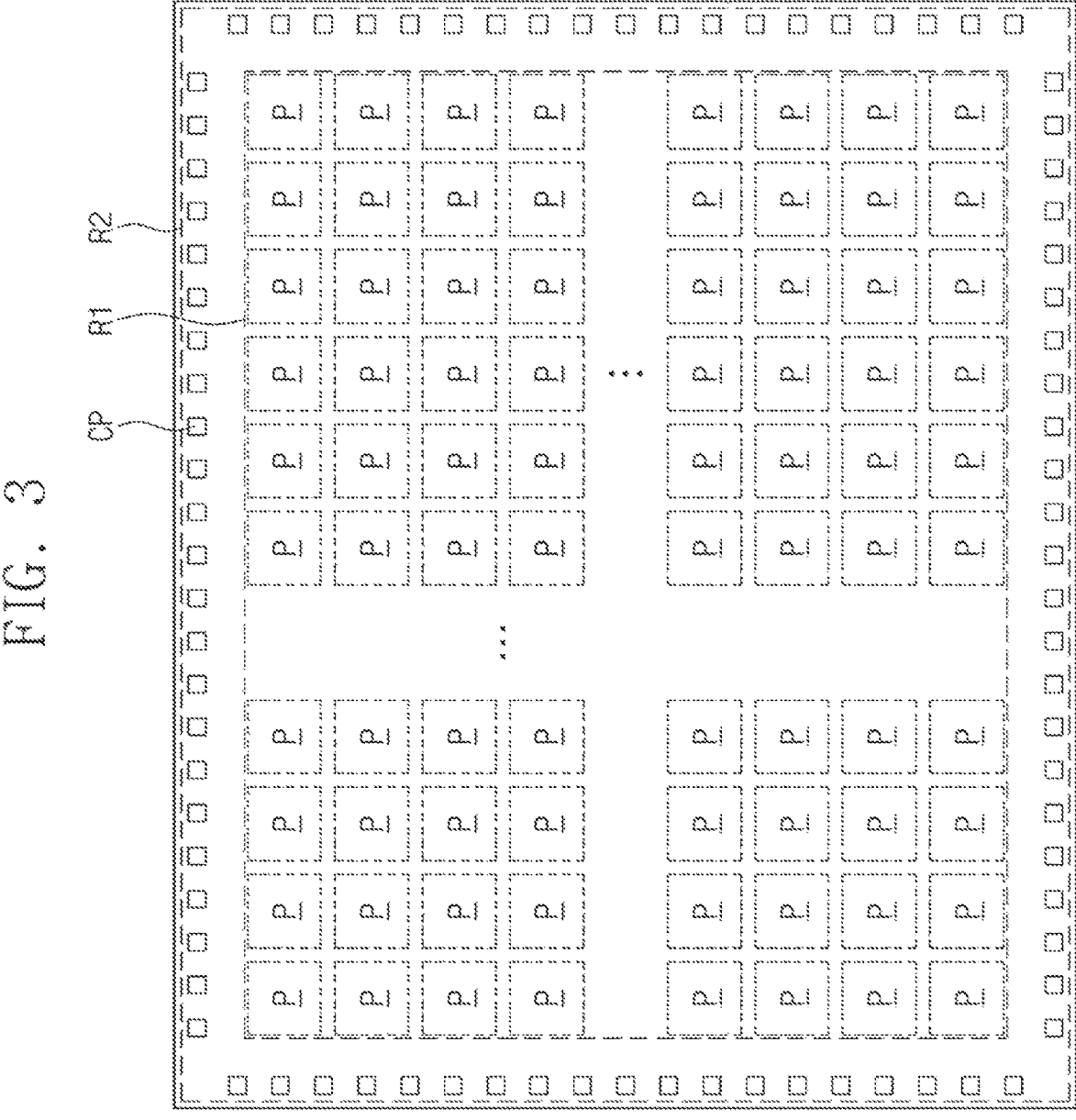
FIG. 3 is a schematic plan view of an image sensor according to an embodiment.

FIG. 3 is a schematic plan view of an image sensor according to embodiments.

Referring to FIG. 3, an image sensor includes a pixel array region R1 and a pad region R2.

A plurality of unit pixels P may be two-dimensionally arranged in a first direction and a second direction which cross each other in the pixel array region R1. An electrical signal generated by incident light may be output from each of the unit pixels P of the pixel array region R1.

According to embodiments, each of the unit pixels P may include a photodetector and a pixel transistor.

The pad region R2 may be disposed to surround the pixel array region R1 in a plan view, to facilitate electrical connection with external devices. A plurality of conductive pads CP used to input and output control signals and photoelectric signals may be disposed in the pad region R2. The conductive pads CP may input/output an electrical signal generated from the unit pixels P to an external device.

Figure 4:
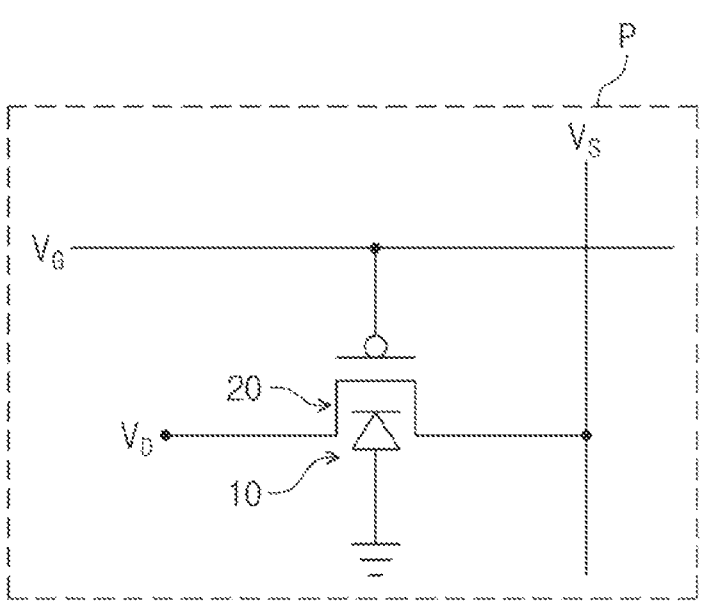
FIG. 4 is a circuit diagram illustrating a unit pixel of an image sensor according to an embodiment.

FIG. 4 is a circuit diagram illustrating a unit pixel of an image sensor according to embodiments.

Referring to FIG. 4, a unit pixel P may include a photodetector 10 and one pixel transistor 20.

The photodetector 10 may include a photodiode and a transistor.

The diode of the photodetector 10 may have one end connected to the ground, and the other end connected to a body or channel of the pixel transistor 20 or may be electrically isolated. When a single photon is incident on the photodetector 10 while a reverse bias voltage is applied to a pn junction region of the photodetector 10, the photon may be detected by a change in a potential of the body of the pixel transistor 20.

According to embodiments, the pixel transistor 20 may be an n-type or p-type MOS transistor. A threshold voltage of the pixel transistor 20 or the amount of current flowing in the channel of the pixel transistor 20 may vary depending on the amount of charges generated (or accumulated) in the photodetector 10. Using this, the single photon may be detected by sensing a voltage or current output from a source or drain of the pixel transistor 20, in each of the turn-off and turn-on states of the pixel transistor 20.

A gate voltage $V_G$ may be applied to a gate of the pixel transistor 20, a source voltage $V_S$ may be applied to the source of the pixel transistor 20, and a drain voltage $V_D$ may be applied to the drain of the pixel transistor 20. The unit pixel P may perform a photocharge integration operation, a readout operation, and a reset operation depending on conditions of the source voltage $V_S$ and the gate voltage $V_G$.

Figure 5:
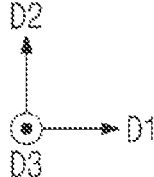
FIG. 5 is a plan view illustrating a part of an image sensor according to an embodiment.

FIG. 5 is a plan view illustrating a part of an image sensor according to embodiments. FIGS. 6A, 6B, 6C, 6D, 6E, and 6F are cross-sectional views of image sensors according to embodiments, taken along line A-A' of FIG. 5.

Figure 6A:
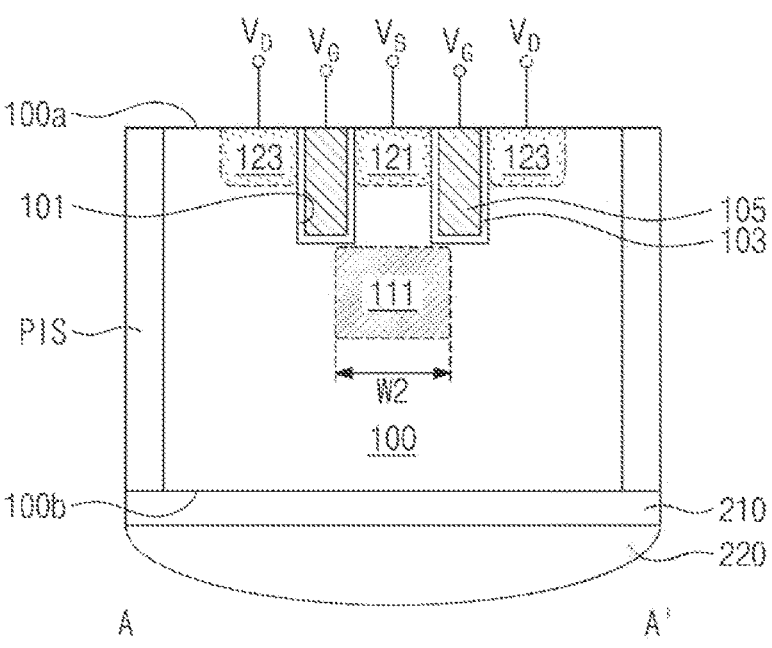
FIGS. 6A, 6B, 6C, 6D, 6E, and 6F are cross-sectional views of image sensors according to embodiments, taken along line A-A' of FIG. 5.

Referring to FIGS. 5 and 6A, an image sensor according to embodiments may include a semiconductor substrate 100, which may include for example a photoelectric conversion region, a charge pocket region 111, a vertical gate electrode 105, a source region 121, which may include for example a first impurity region, and a drain region 123, which may include for example a second impurity region.

The semiconductor substrate 100 may have a first surface 100*a*, which may be referred for example as a front surface, and a second surface 100*b*, which may be referred to for example as a rear surface, which face each other. The semiconductor substrate 100 may include a semiconductor material such as silicon (Si), germanium (Ge), gallium arsenide (GaAs), indium gallium arsenide (InGaAs), gallium phosphide (GaP), or indium phosphorus (InP), or a compound semiconductor material.

For example, the semiconductor substrate 100 may be an epitaxial layer including impurities of first or second conductivity type. In embodiments, the semiconductor substrate 100 may be a bulk semiconductor substrate including wells of the first or second conductivity type. Photocharges may be generated in the semiconductor substrate 100 (e.g., the photoelectric conversion region) by light incident through the second surface 100*b* of the semiconductor substrate 100.

A pixel isolation structure PIS may be disposed in the semiconductor substrate 100 to define a plurality of pixel regions PR. The pixel regions PR may be arranged in a first direction D1 and a second direction D2 which cross each other.

The pixel isolation structure PIS may extend vertically from the first surface 100*a* to the second surface 100*b* of the semiconductor substrate 100. The pixel isolation structure PIS may include first portions extending parallel to one another in the first direction D1 and second portions extending parallel to one another in a second direction D2 across the first portions. The pixel isolation structure PIS may surround each pixel region PR in a plan view.

The pixel isolation structure PIS may be formed of an insulating material having a lower refractive index than that of the semiconductor substrate 100 (e.g., silicon), and may include one or a plurality of insulating layers. For example, the pixel isolation structure PIS may include a silicon oxide layer and a silicon nitride layer. The pixel isolation structure PIS may be formed by patterning the first surface 100*a* and/or the second surface 100*b* of the semiconductor substrate 100 to form a deep trench, and then filling the insulating material in the deep trench.

In the embodiment shown in FIG. 6A, the pixel isolation structure PIS may fully pass through the semiconductor substrate 100 vertically. For example, a vertical thickness of the pixel isolation structure PIS may be substantially the same as a vertical thickness of the semiconductor substrate 100.

Figure 6B:
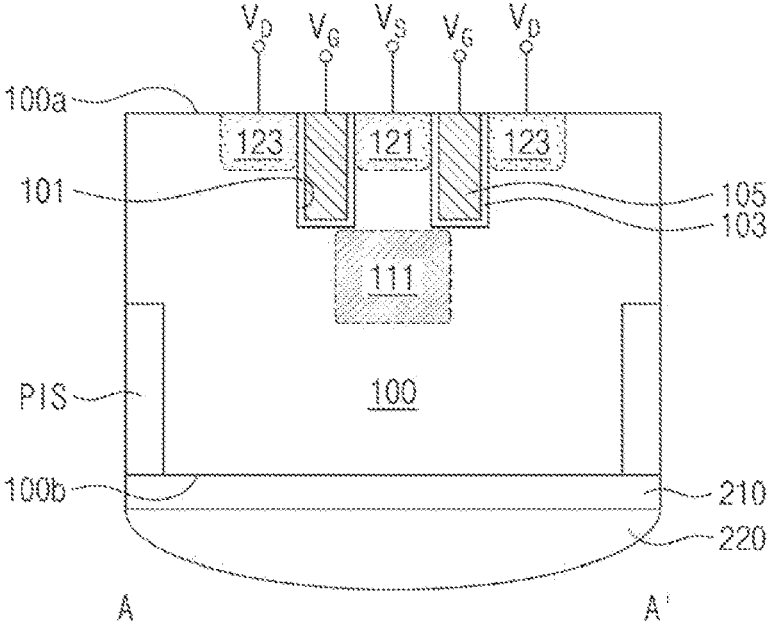

As another example, referring to FIG. 6B, the pixel isolation structure PIS may partially pass through the semiconductor substrate 100. The pixel isolation structure PIS may partially pass through the semiconductor substrate 100, vertically. For example, when the vertical gate electrode 105 is disposed in a trench formed on the first surface 100*a* of the semiconductor substrate 100, the pixel isolation structure PIS may extend vertically from the second surface 100*b* of the semiconductor substrate 100 and may be vertically spaced apart from the first surface 100*a* of the semiconductor substrate 100.

In some embodiments, a pixel transistor (for example pixel transistor 20 of FIG. 4) may be provided in each pixel region PR of the semiconductor substrate 100. The pixel transistor (for example pixel transistor 20 of FIG. 4) may include the vertical gate electrode 105, the source region 121, and the drain region 123.

The vertical gate electrode 105 may be provided in a vertical trench 101 recessed from the first surface 100*a* of the semiconductor substrate 100. The vertical gate electrode 105 may have a structure inserted into the semiconductor substrate 100. The vertical gate electrode 105 may include polysilicon doped with impurities or a metal material.

A bottom surface of the vertical gate electrode 105 may be positioned at a different level from the first surface 100*a* of the semiconductor substrate 100 and may be adjacent to the charge pocket region 111. In embodiments, the vertical gate electrode 105 may be disposed on the charge pocket region 111. In embodiments, the vertical gate electrode 105 may overlap the charge pocket region 111 in a plan view, for example the view shown in FIG. 5.

A turn-on voltage or a turn-off voltage may be applied to the vertical gate electrode 105 during operation of the image sensor. When the turn-on voltage is applied to the vertical gate electrode 105, the vertical gate electrode 105 may form a channel in a direction perpendicular to the first surface 100*a* of the semiconductor substrate 100.

For example, the vertical gate electrode 105 may have a closed curve shape (for example a ring shape or a tube shape) in a plan view. The vertical gate electrode 105 may have an opening that is an empty space in a center thereof, for example, a hollow region.

In an embodiment, the vertical gate electrode 105 may have a rectangular shape having an opening in a center thereof, in a plan view. For example, the vertical gate electrode 105 may include first and second surfaces S1 and S2 that are parallel to and opposite to each other in the first direction D1, and third and fourth surfaces S3 and S4 that are parallel to and opposite to each other in the second direction D2 perpendicular to the first direction D1.

A gate insulating layer 103 may be interposed between the vertical gate electrode 105 and the semiconductor substrate 100. The gate insulating layer 103 may conformally surround a bottom surface and sidewalls of the vertical gate electrode 105 in the semiconductor substrate 100. The gate insulating layer 103 may be formed of, for example, a silicon oxide layer, a silicon oxynitride layer, a high-k layer having a higher dielectric constant than that of the silicon oxide layer, or a combination thereof.

The charge pocket region 111 may be provided in the semiconductor substrate 100 under the vertical gate electrode 105. The charge pocket region 111 may be pn junctioned to the semiconductor substrate 100 to form a photodetector (for example photodetector 10 of FIG. 4). For example, the semiconductor substrate 100 may be p-type, and the charge pocket region 111 may include n-type impurities. However, embodiments are not limited thereto. For example, the semiconductor substrate 100 may be n-type, and the charge pocket region 111 may include p-type impurities.

The charge pocket region 111 may be vertically spaced apart from the source region 121. The charge pocket region 111 may be provided locally in the semiconductor substrate 100 e.g., a photoelectric conversion region) in each pixel region PR. The charge pocket region 111 may be an impurity region doped with impurities of a first conductivity type (e.g., n-type) or a second conductivity type (e.g., p-type). An impurity concentration in the charge pocket region 111 may be higher than an impurity concentration in the semiconductor substrate 100.

When the charge pocket region 111 is doped with n-type impurities, electrons generated by incident light may be accumulated in the charge pocket region 111 while the unit pixel operates in an integration mode. In embodiments, when the charge pocket region 111 is doped with p-type impurities, holes generated by incident light may be accumulated in the charge pocket region 111 while the unit pixel operates in an integration mode.

The charge pocket region 111 may have a second width W2 smaller than a first width W1 of the vertical gate electrode 105. The second width W2 of the charge pocket region 111 may be greater than a width of the source region 121. For example, a part of the charge pocket region 111 may vertically overlap the source region 121.

The source region 121 may be provided inside the vertical gate electrode 105, and the drain region 123 may be provided outside the vertical gate electrode 105. The source region 121 and the drain region 123 may be formed by doping impurities having a conductivity type opposite to that of the charge pocket region 111 into the semiconductor substrate.

For example, the source region 121 may be surrounded by the vertical gate electrode 105 in a plan view. For example, the source region 121 may be provided in the opening of the vertical gate electrode 105. The source region 121 may be vertically spaced apart from the charge pocket region 111. When the image sensor operates, a pixel signal may be output from the source region 121, or a certain reset voltage may be applied to the source region 121.

The drain region 123 may surround at least a part of the vertical gate electrode 105. In one example, the drain region 123 may completely surround the vertical gate electrode 105. For example, the drain region 123 may be adjacent to the first to fourth surfaces S1 to S4 of the vertical gate electrode 105.

According to embodiments, a potential of a channel which is formed under the vertical gate electrode 105 and is between the drain region 123 and the source region 121 may vary depending on charges accumulated or generated in the charge pocket region 111.

Figure 6C:
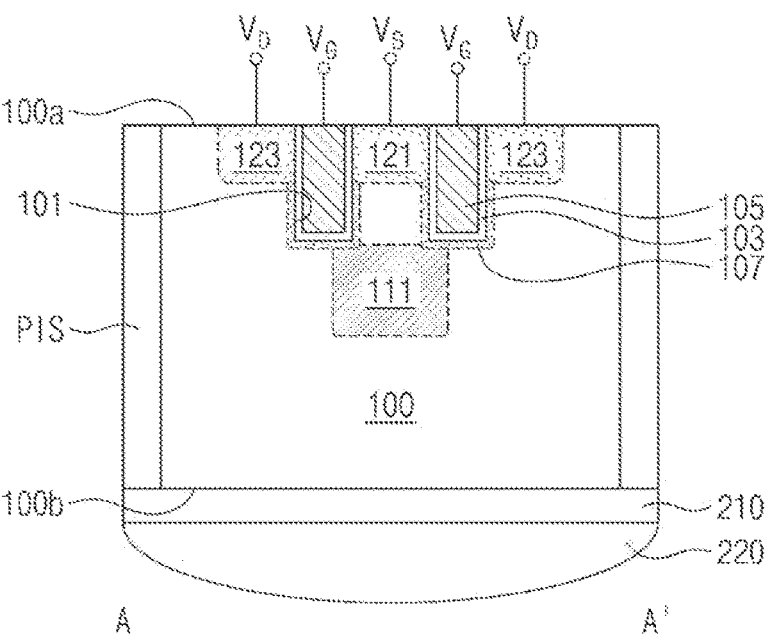

According to the embodiment illustrated in FIG. 6C, a channel impurity region 107 may be provided between the source region 121 and the drain region 123. The channel impurity region 107 may be adjacent to the bottom surface and side surfaces of the vertical gate electrode 105. The channel impurity region 107 may include impurities of the same conductivity type as that of the source region 121 and drain region 123, and an impurity concentration of the channel impurity region 107 may be lower than that of the source region 121 and drain region 123. By forming the channel impurity region 107 under the vertical gate electrode 105, a threshold voltage of the pixel transistor 20 may be adjusted.

Figure 6D:
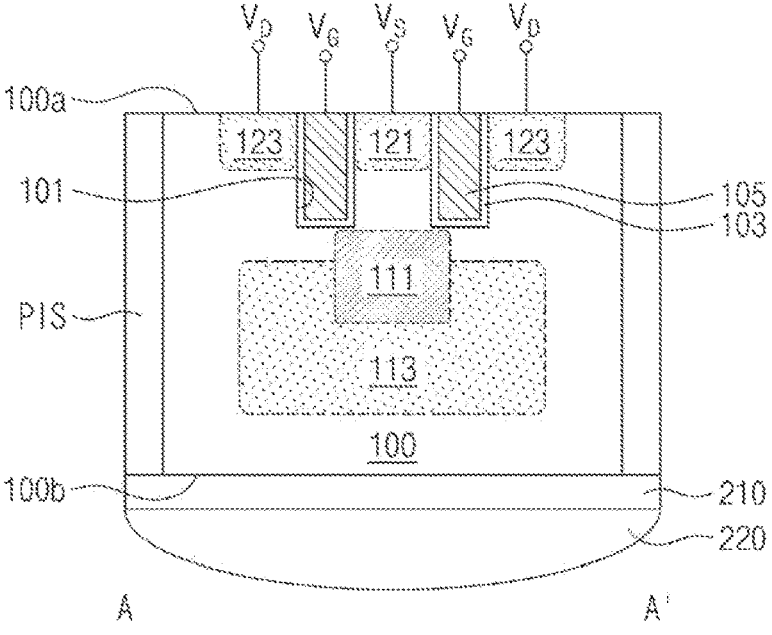

According to the embodiment shown in FIG. 6D, the image sensor may further include a charge collection region 113 provided around the charge pocket region 111. The charge collection region 113 may be an impurity region doped with impurities having the same conductivity type as that of the charge pocket region 111. An impurity concentration in the charge collection region 113 may be lower than an impurity concentration in the charge pocket region 111.

A surface insulating layer 210 may be provided on the second surface 100b of the semiconductor substrate 100. The surface insulating layer 210 may include a fixed charge layer, an antireflection layer, and a planarization layer. The fixed charge layer may prevent charges (e.g., electrons or holes) generated by defects existing on the second surface 100b of the semiconductor substrate 100 from moving to photoelectric conversion regions. For example, the fixed charge layer may include a metal oxide or a metal fluoride including at least one metal selected from the group consisting of hafnium (Hf), zirconium (Zr), aluminum (Al), tantalum (Ta), titanium (Ti), yttrium (Y), and lanthanoid (La). The antireflection layer may prevent light incident on the semiconductor substrate 100 from being reflected on the second surface 100b of the semiconductor substrate 100, and may be formed of a material having a refractive index smaller than that of the semiconductor substrate 100. The antireflection layer may include, for example, hafnium oxide ($HfO_2$), aluminum oxide ($Al_2O_3$), titanium oxide ($TiO_2$), strontium titanium oxide (STO), or the like. The planarization layer may be formed of an insulating layer such as silicon oxide ($SiO_2$), silicon nitride (SiN), or silicon oxynitride (SiON), or an organic material such as resin.

Micro-lenses 220 may be disposed on the surface insulating layer 210 to respectively correspond to the pixel regions PR. The micro-lenses 220 may have a convex shape and may have a certain radius of curvature. The micro-lenses 220 may be formed of a light-transmitting resin.

Figure 6E:
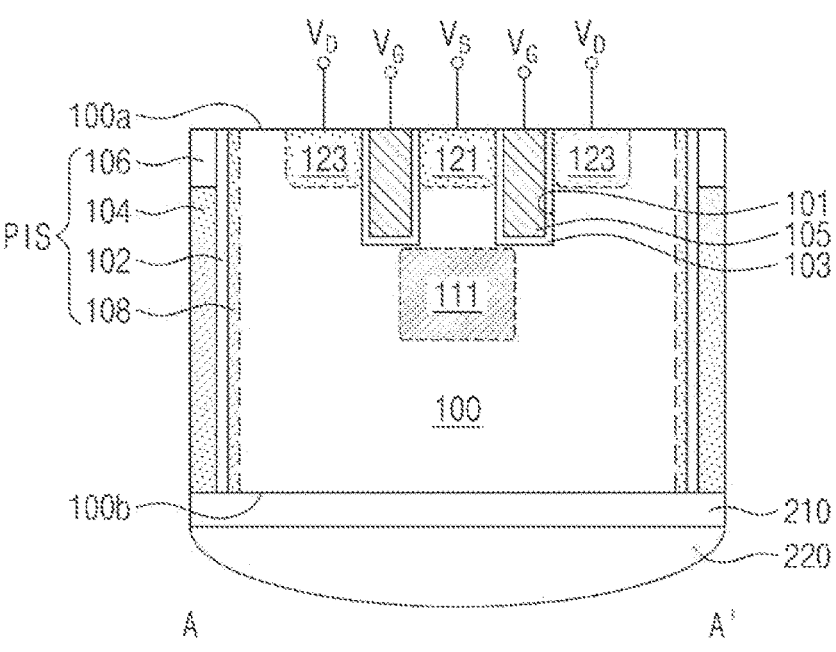

Referring to FIG. 6E, in the image sensor according to embodiments, the pixel isolation structure PIS may include a liner insulating pattern 102, a semiconductor pattern 104, a buried insulating pattern 106, and a potential barrier layer 108.

The liner insulating pattern 102 may be provided between the semiconductor pattern 104 and the semiconductor substrate 100. The liner insulating pattern 102 may be in contact with the semiconductor substrate 100, directly. The liner insulating pattern 102 may include a material having a lower refractive index than that of the semiconductor substrate 100. The liner insulating pattern 102 may include, for example, a silicon-based insulating material (e.g., silicon nitride, silicon oxide, and/or silicon oxynitride) and/or a high-k material (e.g., hafnium oxide and/or aluminum oxide). As another example, the liner insulating pattern 102 may include a plurality of layers, and the layers may include different materials.

The semiconductor pattern 104 may include a crystalline semiconductor material, for example, polysilicon. For example, the semiconductor pattern 104 may further include a dopant in a semiconductor material, and the dopant may include impurities of a first conductivity type or impurities of a second conductivity type. The semiconductor pattern 104 may be formed of an undoped polysilicon layer, a doped polysilicon layer, air, and/or a combination thereof.

The buried insulating pattern 106 may be disposed on a top surface of the semiconductor pattern 104, and a top surface of the buried insulating pattern 106 may be substantially positioned at the same level as the first surface 100a of the semiconductor substrate 100. The buried insulating pattern 106 may include at least one of a silicon oxide layer, a silicon oxynitride layer, and a silicon nitride layer.

The potential barrier layer 108 may include impurities of the same conductivity type (e.g., p-type) as that of the semiconductor substrate 100. The potential barrier layer may reduce occurrence of a dark current due to an electron-hole pair (EHP) generated by a surface defect of a deep trench which is formed by patterning the semiconductor substrate 100.

Figure 6F:
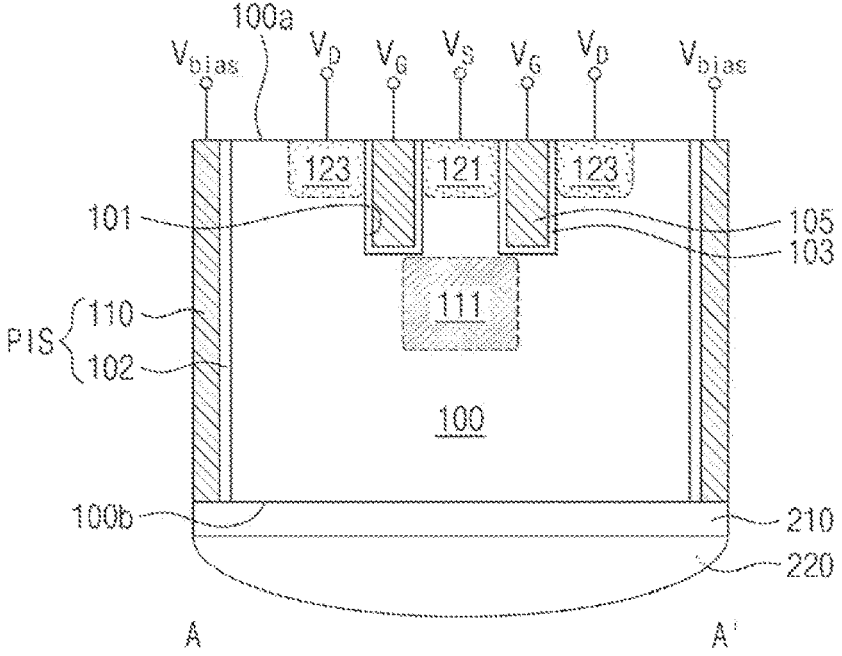

Referring to FIG. 6F, in the image sensor according to embodiments, the pixel isolation structure PIS may include a liner insulating pattern 102 and a conductive pattern 110.

The liner insulating pattern 102 may be provided between the conductive pattern 110 and the semiconductor substrate 100. As described above, the liner insulating pattern 102 may include a material having a lower refractive index than that of the semiconductor substrate 100.

The conductive pattern 110 may be provided in a deep trench in which the liner insulating pattern 102 is formed and may include a metal material such as tungsten (W). In some embodiments, a negative bias Vbias may be applied to the conductive pattern 110, thereby reducing a dark current generated at the boundary between the pixel isolation structure PIS and the semiconductor substrate 100.

Figure 7A:
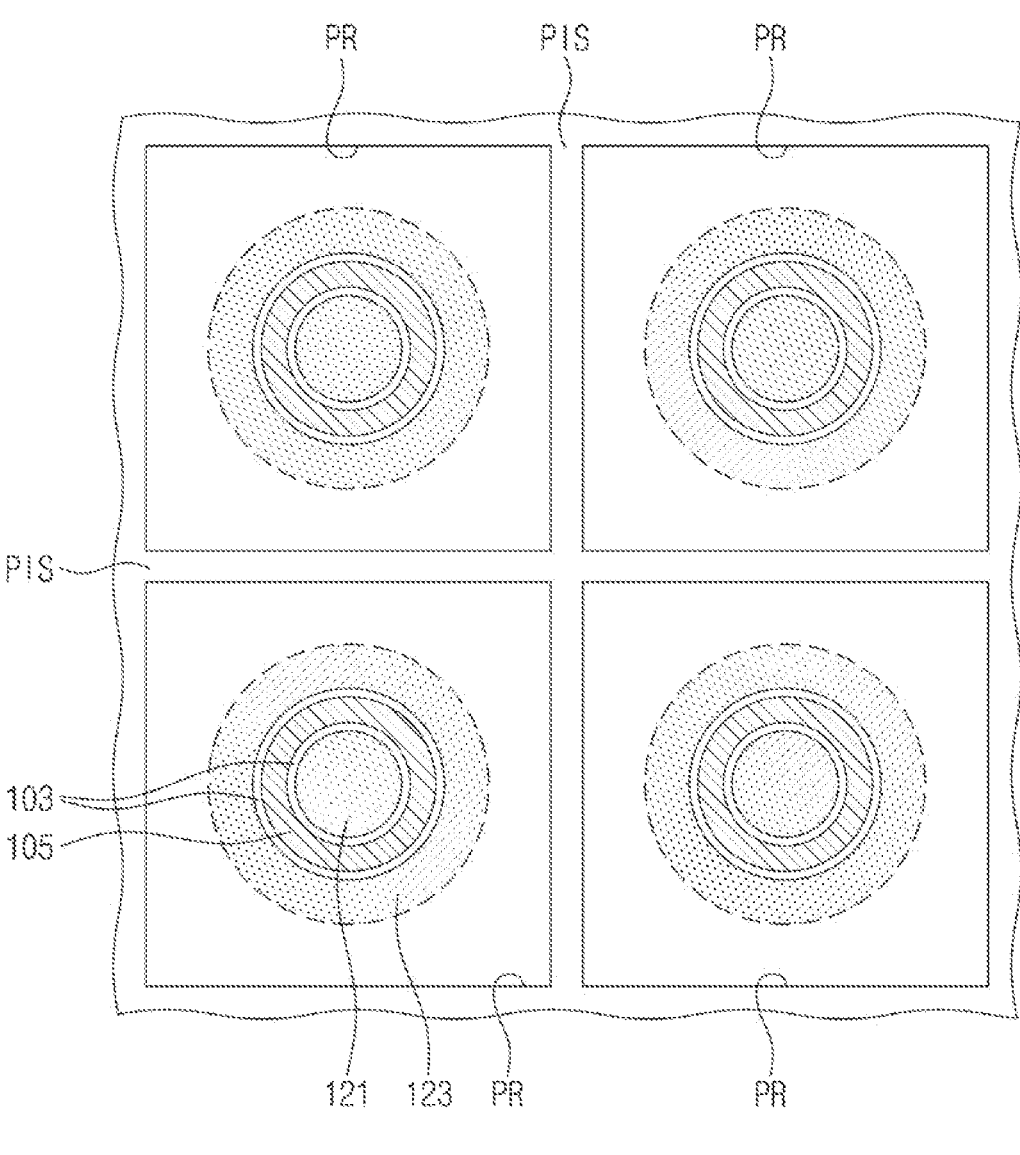
FIGS. 7A, 7B, and 7C are plan views of image sensors according to embodiments.
Figure 7A:
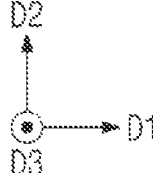
Figure 7B:
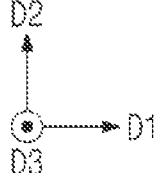
Figure 7C:
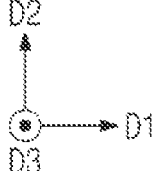

FIGS. 7A, 7B, and 7C are plan views of image sensors according to embodiments. For simplicity of description, the same components as those of the above-described embodiments are shown with the same reference numerals, and duplicative description thereof will be simplified or omitted.

Referring to FIG. 7A, the vertical gate electrode 105 may have a circular ring shape in a plan view. In embodiments, the shape of the vertical gate electrode 105 is not limited thereto, and may have various shapes such as a rhombus or a pentagon.

As described above, the vertical gate electrode 105 may be disposed at a center of each pixel region PR and may completely surround the source region 121.

Referring to FIG. 7B, the vertical gate electrode 105 may have a rectangular ring shape, as described above, with the first and second surfaces parallel to the first direction and the third and fourth surfaces parallel to the second direction.

The source region 121 may be completely surrounded by the vertical gate electrode 105, and the drain region 123 may partially surround the vertical gate electrode 105.

Although the drain region 123 partially surrounds the vertical gate electrode 105, the potential of the channel formed between the drain region 123 and the source region 121 under the vertical gate electrode 105 may vary depending on the charges accumulated or generated in the charge pocket region 111.

Referring to FIG. 7C, the vertical gate electrode 105 may have a partially opened shape. In other words, the source region 121 may be disposed on one side of the vertical gate electrode 105 and may partially surround the source region 121.

In a plan view, the vertical gate electrode 105 may have a 'C' shape, a 'L' shape, or a 'reverse L' shape. For example, the vertical gate electrode 105 may include first portions P1 parallel to each other and a second portion P2 connecting the first portions P1 to each other. Here, the first portions P1 may be parallel to a diagonal direction with respect to the first and second directions D1 and D2, for example a direction that is on a plane including the first and second directions D1 and D2, and at an angle with respect to the first direction D1 and at the same or a different angle with respect to second direction D2, such that the direction is between the first and second directions D1 and D2.

The source region 121 may be aligned with inner walls of the first and second portions P1 and P2 of the vertical gate electrode 105. The drain region 123 may be disposed on the other side of the vertical gate electrode 105, and the drain region 123 may be adjacent to the second portion P2 of the vertical gate electrode 105. In embodiments, the drain region 123 may be adjacent to parts of the first portions P1 and the second portions P2 of the vertical gate electrode 105.

FIGS. 8A and 8B are voltage condition tables for explaining operation of image sensors according to embodiments.

FIG. 8A illustrates an operating voltage condition of a unit pixel including a PMOS pixel transistor.

For example, referring to FIGS. 6A and 8A, a reset operation for discharging charges accumulated in the charge pocket region 111 may be performed. For the reset operation, current may flow from the source to the drain of the pixel transistor while the pixel transistor is turned off. For example, during the reset operation, a gate voltage $V_G$ of 0V or less (e.g., a negative voltage) may be applied to the vertical gate electrode 105, a drain voltage $V_D$ of 0V (or ground voltage) may be applied to the drain region 123, and a source voltage $V_S$ of about 1V or more may be applied to the source region 121.

After the reset operation, a photocharge integration operation, which may also be referred to as a charge integration operation, for accumulating or storing photocharges in the charge pocket region 111 may be performed. For example, during the charge integration operation, a drain voltage $V_D$ of 0V (or ground voltage) may be applied to the drain region 123, and a positive voltage of about 0V or more may be applied as a gate voltage $V_G$ to allow the pixel transistor 20 to be turned off, and a source voltage $V_S$ of 0V (or ground voltage) may be applied.

Under this voltage condition, the pixel transistor may be turned off, and electrons generated by a single photon incident on the semiconductor substrate 100 may be accumulated in the charge pocket region 111. As the electrons are accumulated in the charge pocket region 111, a threshold voltage of the pixel transistor may increase. According to embodiments, the single photon may be detected without occurrence of an avalanche phenomenon with a low voltage. In embodiments, it is also possible to add an operation of inducing the avalanche phenomenon by applying a high bias voltage to a photodiode and an operation of amplifying the photocharge.

Thereafter, a readout operation may be performed, and a negative voltage (e.g., a threshold voltage such as for example −0.5 V or less) of the pixel transistor may be applied to the vertical gate electrode 105 as a gate voltage $V_G$ to allow the pixel transistor to be turned on. Here, the threshold voltage of the pixel transistor may be a threshold voltage in a state in which there is no influence by the charges stored in the charge pocket region 111. A voltage of 0V (or ground voltage) may be applied to a drain voltage $V_D$. Under this condition, the pixel transistor may operate as a source follower, and a source voltage $V_S$ may be decreased by the increased threshold voltage. For example, a difference between the source voltage $V_S$ immediately after the reset operation and the source voltage $V_S$ in the readout operation may be detected, thereby allowing photons incident on the semiconductor substrate 100 to be counted.

FIG. 8B illustrates an operating voltage condition of a unit pixel including an NMOS pixel transistor.

For example, referring to FIGS. 6A and 8B, during a reset operation, a gate voltage $V_G$ and a source voltage $V_S$, a drain voltage $V_D$ may be applied to enable current to flow from the drain to the source in a state in which the pixel transistor is turned on. For example, a power supply voltage Vdd of about 2.8V to 3.3V may be applied as a drain voltage $V_D$ and a gate voltage $V_G$, and a voltage lower than the drain voltage $V_D$ may be applied as a source voltage $V_S$.

During a charge integration operation, the power supply voltage Vdd of about 2.8V to 3.3V may be applied as a drain voltage $V_D$, a gate voltage $V_G$ of 0V may be applied to allow the pixel transistor to be turned off, and the power voltage Vdd may be applied as a source voltage $V_S$. Under this voltage condition, an avalanche phenomenon may occur by a single photon incident on the semiconductor substrate 100, and thus holes generated may be accumulated in the charge pocket region 111 doped with a p-type impurities. The holes stored in the charge pocket region 111 may reduce the threshold voltage of the pixel transistor.

Thereafter, a readout operation may be performed, and a gate voltage $V_G$ greater than or equal to a threshold voltage (e.g., about 0.5V) may be applied to allow the pixel transistor to be turned on, and the power supply voltage Vdd may be applied as a drain voltage $V_D$. Under this condition, a source voltage $V_S$ output from the source region 121 of the pixel transistor may be increased by the reduced threshold voltage. For example, the change in the voltage output from the source voltage $V_S$ before and after the charge integration operation may be detected, thereby allowing photons incident on the semiconductor substrate 100 to be counted.

Figure 9:
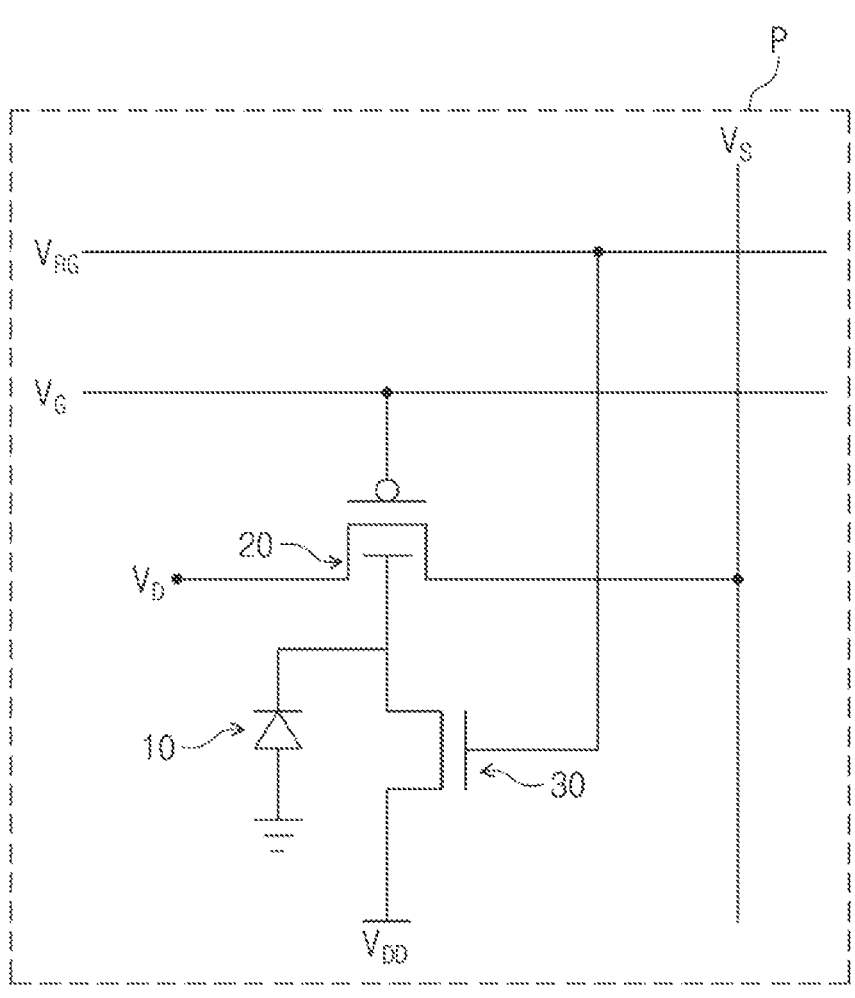
FIG. 9 is a circuit diagram illustrating a unit pixel of an image sensor according to an embodiment.

FIG. 9 is a circuit diagram illustrating a unit pixel of an image sensor according to embodiments. For simplicity of description, the same components as those of the embodiments described above with reference to FIG. 4 are denoted by the same reference numerals, and duplicative description thereof will be simplified or omitted.

Referring to FIG. 9, a unit pixel P may include a photodetector 10, a pixel transistor 20, and a reset transistor 30.

The photodetector 10 may include photodiodes, as described above.

The pixel transistor 20 may be an n-type or p-type MOS transistor. A threshold voltage of the pixel transistor 20 or the amount of current flowing through a channel of the pixel transistor 20 may vary depending on the amount of charges generated (or accumulated) in the photodetector 10. Using this, a single photon may be detected by sensing a voltage or current output from a source of the pixel transistor 20 in each of turn-off and turn-on states of the pixel transistor 20.

A drain of the reset transistor 30 may be connected to a power supply voltage $V_{DD}$, and a source of the reset transistor 30 may be electrically connected to or disconnected from the photodetector 10 depending on a reset gate voltage $V_{RG}$ applied to a reset gate electrode.

The unit pixel P may perform a photocharge integration operation, a readout operation, and a reset operation depending on conditions of a source voltage $V_S$, a gate voltage $V_G$, and the reset gate voltage $V_{RG}$, respectively.

Figure 10:
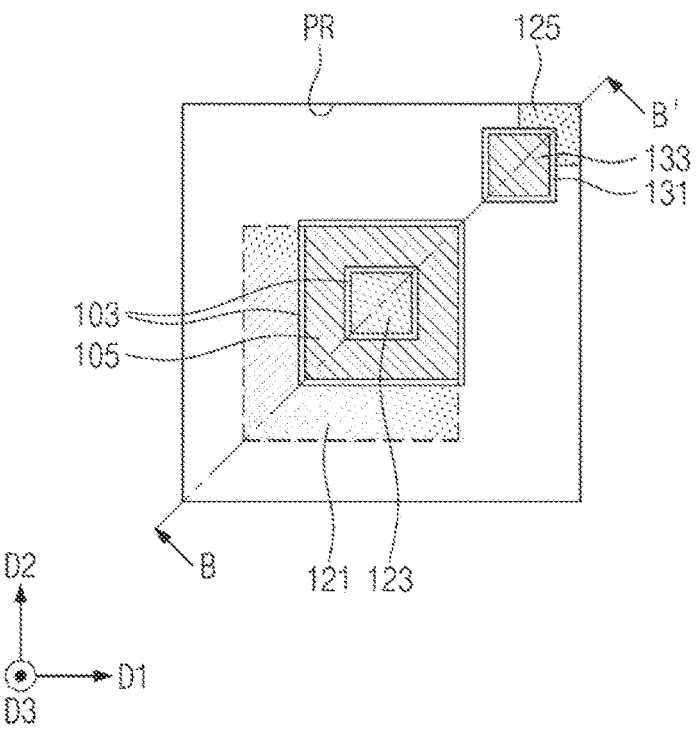
FIG. 10 is a plan view illustrating a part of an image sensor according to an embodiment.
Figure 11:
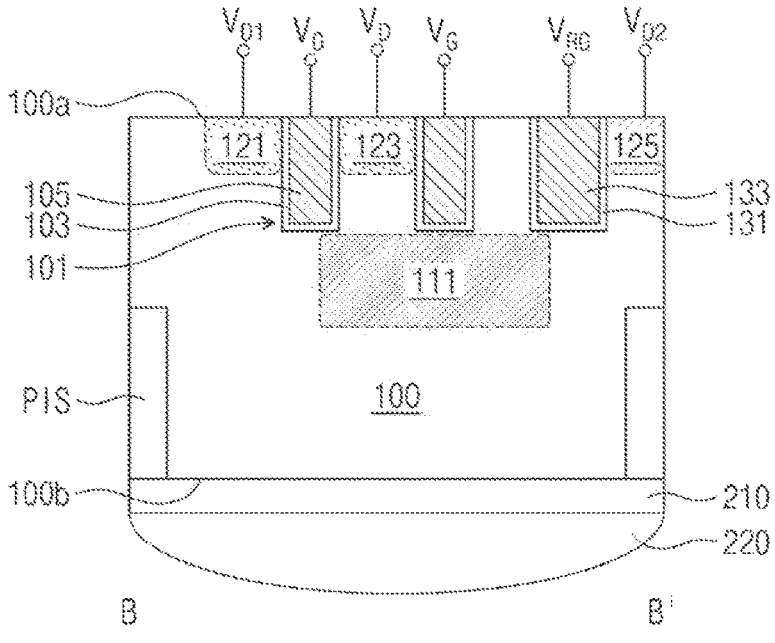
FIG. 11 shows a cross-section taken along the line B-B' of FIG. 10, according to an embodiment.

FIG. 10 is a plan view illustrating a part of an image sensor according to embodiments. FIG. 11 is a cross-sectional view taken along line B-B' of FIG. 10. For simplicity of description, the same components as those of the embodiments described above with reference to FIGS. 5 and 6A to 6F are denoted by the same reference numerals, and duplicative description thereof will be simplified or omitted.

Referring to FIGS. 10 and 11, a pixel isolation structure PIS may be disposed in a semiconductor substrate 100 to define a plurality of pixel regions PR. The pixel regions PR may be arranged in a first direction D1 and a second direction D2 which cross each other. Here, the pixel isolation structure PIS may vertically pass through a part of the semiconductor substrate 100. For example, the pixel isolation structure PIS may extend vertically from a second surface 100b of the semiconductor substrate 100 and may be vertically spaced apart from a first surface 100a of the semiconductor substrate 100.

In embodiments, a pixel transistor (for example the pixel transistor 20 of FIG. 9) and a reset transistor (for example the reset transistor 30 of FIG. 9) may be provided in each pixel region PR of the semiconductor substrate 100. The pixel transistor (for example the pixel transistor 20 of FIG. 9) may include a vertical gate electrode 105, a source region 121, and a drain region 123. The reset transistor (for example the reset transistor 30 of FIG. 9) may include a reset gate electrode 133 and a reset drain region 125.

The vertical gate electrode 105 may be provided in a vertical trench 101 recessed from the first surface 100a of the semiconductor substrate 100, as described above with reference to FIGS. 5 and 6A. The vertical gate electrode 105 may have a rectangular shape having an opening in a center thereof in a plan view.

The source region 121 may be provided inside the vertical gate electrode 105, and the drain region 123 may be provided outside the vertical gate electrode 105. The source region 121 may be surrounded by the vertical gate electrode 105, and the drain region 123 may partially surround the vertical gate electrode 105.

A charge pocket region 111 may be provided in the semiconductor substrate under the vertical gate electrode 105. The charge pocket region 111 may be vertically spaced apart from the source region 121. The charge pocket region 111 may include impurities having a conductivity type opposite to that of the source region 121 and drain region 123. The charge pocket region 111 may overlap the source region 121 and the vertical gate electrode 105 in a plan view. The charge pocket region 111 under the vertical gate electrode 105 may extend laterally to be at least partially disposed under the reset gate electrode 133.

The reset gate electrode 133 may be spaced apart from the vertical gate electrode 105 and the drain region 123 and may be disposed on the semiconductor substrate 100 in the pixel region. The reset gate electrode 133, like the vertical gate electrode 105, may be provided in a trench recessed from the first surface 100a of the semiconductor substrate 100.

The reset gate electrode 133 may include the same conductive material as the vertical gate electrode 105. A bottom surface of the reset gate electrode 133 may be positioned at substantially the same level as a bottom surface of the vertical gate electrode 105.

A reset gate insulating layer 131 may be interposed between the reset gate electrode 133 and the semiconductor substrate 100. The reset gate insulating layer 131 may conformally surround a bottom surface and sidewalls of the reset gate electrode 133 in the semiconductor substrate 100. The reset gate insulating layer 131 may have substantially the same thickness and material as the gate insulating layer 103.

The reset drain region 125 may be provided in the semiconductor substrate 100 at one side of the reset gate electrode 133. The reset drain region 125 may be spaced apart from the vertical gate electrode 105 and the drain region 123. The reset drain region 125 may be formed by doping impurities having the same conductivity type as that of the charge pocket region 111 into the semiconductor substrate 100. The reset drain region 125 may vertically overlap a part of the pixel isolation structure PIS.

Figure 12:
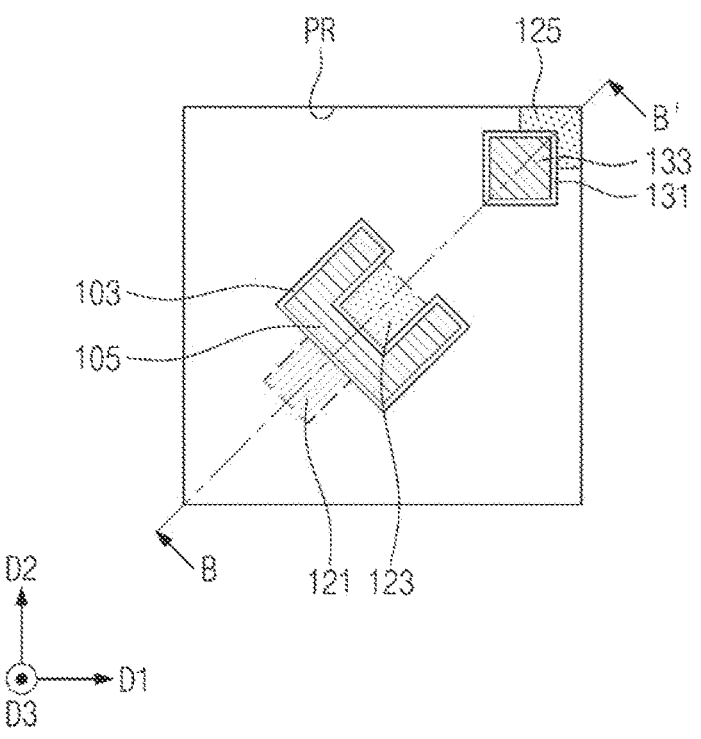
FIG. 12 is a plan view illustrating a part of an image sensor according to an embodiment.
Figure 13:
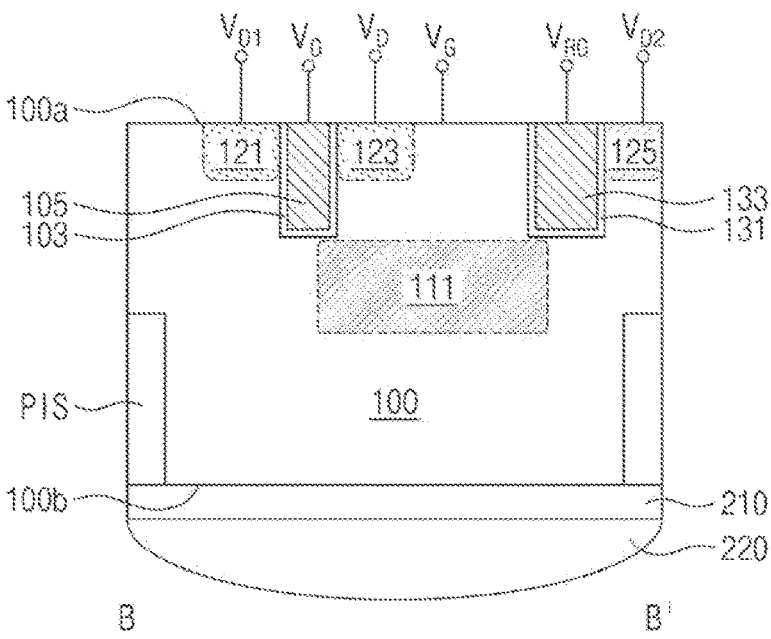
FIG. 13 is a cross-sectional view taken along the line B-B' of FIG. 12, according to an embodiment.

FIG. 12 is a plan view illustrating a part of an image sensor according to embodiments. FIG. 13 is a cross-sectional view taken along line B-B' of FIG. 12. For simplicity of description, the same components as those of the embodiments described above with reference to FIGS. 10 and 11 are denoted by the same reference numerals, and duplicative description thereof will be simplified or omitted.

Referring to FIGS. 12 and 13, as described above, the vertical gate electrode 105, the source region 121, the drain region 123, the reset gate electrode 133, and the reset drain region 125 may be provided on the semiconductor substrate 100 of each pixel region.

As described above with reference to FIG. 7C, the vertical gate electrode 105 may have a partially opened shape. In other words, the source region 121 may be disposed on one side of the vertical gate electrode 105 and may partially surround the source region 121.

The drain region 123 may be disposed on the other side of the vertical gate electrode 105, and the drain region 123 may be spaced apart from the source region 121 with a part of the vertical gate electrode 105 interposed therebetween.

The source region 121 and the drain region 123 may be arranged in a diagonal direction with respect to the first and second directions D1 and D2. Also, the reset gate electrode 133 may be disposed to be diagonally spaced apart from the source region 121.

The charge pocket region 111 under the vertical gate electrode 105 may extend laterally to be at least partially disposed under the reset gate electrode 133, as described above. The charge pocket region 111 may overlap the source region 121 in a plan view.

Figure 14A:
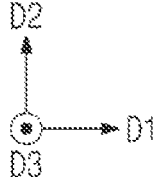
FIGS. 14A, 14B, and 14C are plan views of image sensors according to embodiments.
Figure 14B:
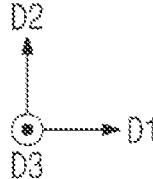
Figure 14C:
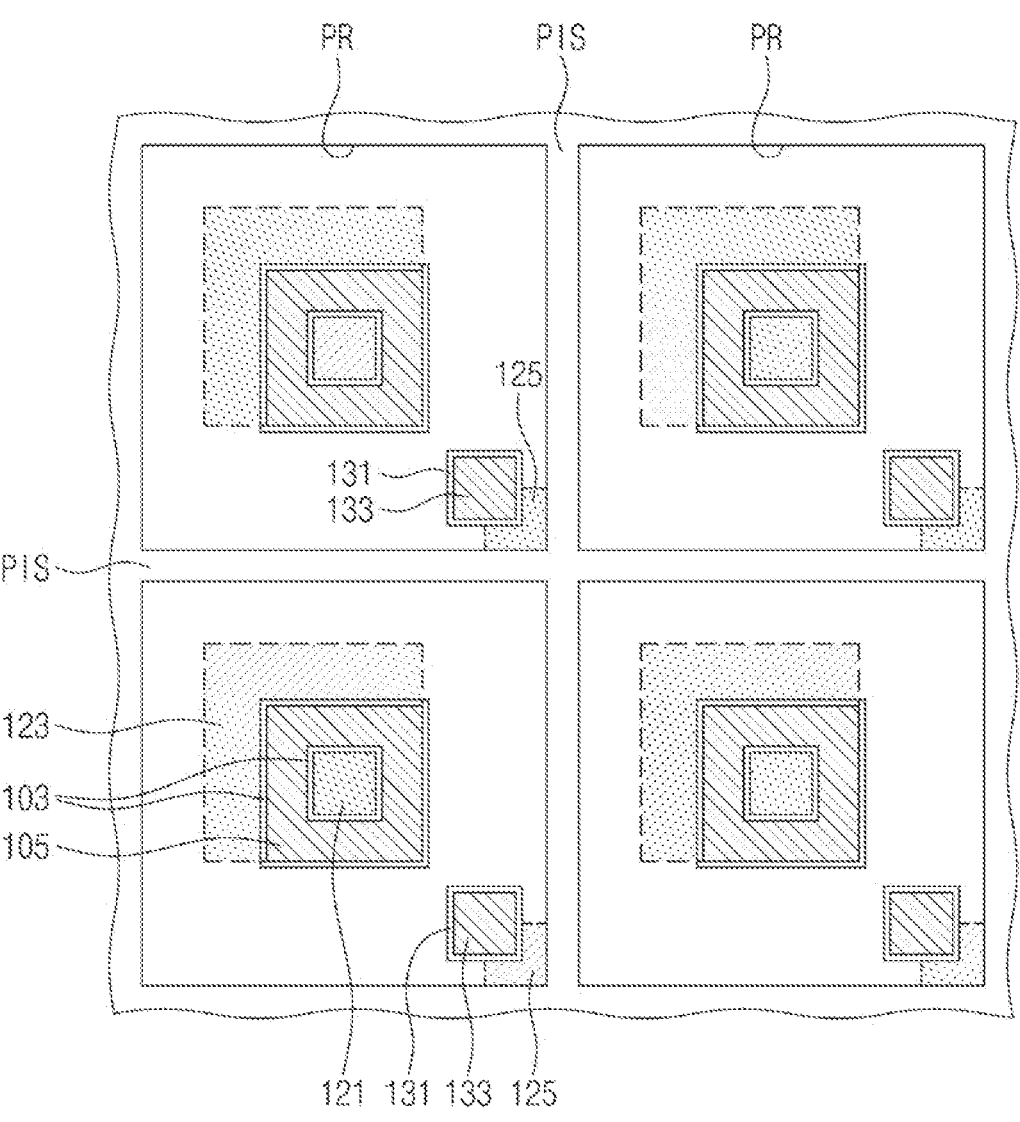
Figure 14C:
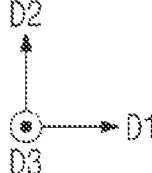

FIGS. 14A, 14B, and 14C are plan views of image sensors according to embodiments. For simplicity of description, the same components as those of the above-described embodiments are shown with the same reference numerals, and duplicative description thereof will be simplified or omitted.

Referring to FIG. 14A, a pixel isolation structure PIS may be disposed in a semiconductor substrate 100 to define a plurality of pixel regions PR. The pixel regions PR may be arranged in a first direction D1 and a second direction D2 which cross each other. The pixel isolation structure PIS may include first separation portions Pa which face each other and are spaced apart from each other in the first direction D1, and second portions Pb which face each other and are spaced apart from each other in the second direction D2.

In each of the pixel regions PR, as described with reference to FIGS. 10 and 11, a vertical gate electrode 105, a source region 121, a drain region 123, and a reset gate electrode 133 may be provided.

In some embodiments, at least two pixel regions PR adjacent to each other may share a reset drain region 125. For example, the four pixel regions PR adjacent to each other may share the reset drain region 125. For example, the reset drain region 125 may be provided in the semiconductor substrate 100 to be adjacent to the reset gate electrodes 133 of the pixel regions PR. The reset drain region 125 may be provided between the first separation portions Pa and between the second separation portions Pb of the pixel isolation structure PIS in a plan view.

Referring to FIG. 14B, the pixel isolation structure PIS may be disposed in the semiconductor substrate 100 to define the plurality of pixel regions PR, and the pixel isolation structure PIS may include the first separation portions Pa which face each other and are spaced apart from each other in the first direction D1, and the second portions Pb which face each other and are spaced apart from each other in the second direction D2.

As described with reference to FIGS. 10 and 11, the vertical gate electrode 105, the source region 121, and the drain region 123 may be provided in each of the pixel regions PR.

In some embodiments, at least two pixel regions PR adjacent to each other may share the reset gate electrode 133 and the reset drain region 125. For example, the four pixel regions PR adjacent to each other may share the reset gate electrode 133 and the reset drain region 125.

In this embodiment, the reset gate electrode 133, like the vertical gate electrode 105, may have a closed curve shape (e.g., a ring shape or a tube shape) in a plan view. The reset gate electrode 133 may have an opening that is an empty space in a center thereof.

The reset gate electrode 133 may be provided between the first separation portions Pa and between the second separation portions Pb of the pixel isolation structure PIS in a plan view. The reset gate electrode 133 may surround the reset drain region 125 in a plan view. For example, the reset drain region 125 may be disposed in the opening of the reset gate electrode 133.

Referring to FIG. 14C, the pixel isolation structure PIS may be disposed in the semiconductor substrate 100 to define the plurality of pixel regions PR. Each pixel region PR may be surrounded by the pixel isolation structure PIS in a plan view.

In this embodiment, the vertical gate electrode 105, the source region 121, the drain region 123, the reset gate electrode 133, and the reset drain region 125 may be provided in each pixel region PR.

In each pixel region PR, the reset gate electrode 133 may be diagonally spaced apart from the vertical gate electrode 105 and the source region 121, and the reset drain region 125 of the pixel regions PR may be spaced apart from one another.

FIGS. 15A and 15B are voltage condition tables for explaining operations of image sensors according to embodiments.

FIG. 15A illustrates an operating voltage condition of a unit pixel including a PMOS pixel transistor.

Referring to FIGS. 11 and 15A, a unit pixel may perform a photocharge integration operation, a readout operation, and a reset operation depending on conditions of a source voltage $V_S$ and a gate voltage $V_G$.

First, the reset operation for discharging charges stored in the charge pocket region 111 may be performed. For example, 0V or a ground voltage may be applied to the drain region 123 as a drain voltage $V_{D1}$, and a voltage of 0V or less may be applied to the vertical gate electrode 105 as a gate voltage $V_G$. In addition, 0V or a ground voltage may be applied to the source region 121 as a source voltage $V_S$, a reset gate voltage $V_{RG}$ of about 1V or more may be applied to the reset gate electrode 133, and a reset drain voltage $V_{D2}$, which may be for example a power voltage Vdd, may be applied to the reset drain region 125. Under this voltage condition, the reset transistor may be turned on, and the pixel transistor may be turned off. Accordingly, charges stored in the charge pocket region 111 may be discharged through the reset drain region 125 to which a power voltage Vdd is applied. Here, the power supply voltage Vdd may be about 2.8V to 3.3V.

After the reset operation, a photocharge integration operation of accumulating or storing photocharges in the charge pocket region 111 may be performed. For example, 0V or a ground voltage may be applied to the drain region 123 as the drain voltage $V_{D1}$, and a voltage greater than or equal to 0V may be applied to the vertical gate electrode 105 as a gate voltage $V_G$. In addition, 0V or a ground voltage may be applied to the source region 121 as a source voltage $V_S$, a reset gate voltage $V_{RG}$ of about 0V or less may be applied to the reset gate electrode 133, and a reset drain voltage $V_{D2}$, which may be for example a power voltage Vdd, may be applied to the reset drain region 125. Under this voltage condition, the pixel transistor and the reset transistor may be turned off, and electrons generated by a single photon incident on the semiconductor substrate may be accumulated in the charge pocket region 111. Accordingly, as the electrons are accumulated in the charge pocket region 111, the threshold voltage of the pixel transistor 20 may increase.

Subsequently, a readout operation of reading a voltage or current output from the unit pixel through the source region 121 may be performed. For example, a negative voltage (e.g., a threshold voltage such as for example, −0.5 V or less) of the pixel transistor may be applied to the vertical gate electrode 105 as a gate voltage $V_G$. The threshold voltage may be a threshold voltage in a state in which there is no influence by the charges stored in the charge pocket region 111. Also, a reset gate voltage $V_{RG}$ of about 0V or less may be applied to the reset gate electrode 133, 0V (or ground voltage) may be applied as a drain voltage $V_{D1}$ to the drain region 123, and the power supply voltage Vdd may be applied to the reset drain region 125 as the reset drain voltage $V_{D2}$. Under this voltage condition, the pixel transistor may be turned on, and the reset transistor may be turned off.

The source voltage $V_S$ may be decreased by the increased threshold voltage due to effects of charges stored in the charge pocket region 111. By sensing the source voltage $V_S$, photons incident on the semiconductor substrate 100 may be counted.

FIG. 15B illustrates an operating voltage condition of a unit pixel including an NMOS pixel transistor.

Referring to FIGS. 11 and 15B, when the charges stored in the charge pocket region 111 are discharged through the reset drain region 125 during a reset operation, the pixel transistor may be turned off, and the reset transistor may be turned on.

For example, the power supply voltage Vdd of about 2.8V to 3.3V may be applied as a drain voltage $V_{D1}$, a source voltage $V_S$, and a gate voltage $V_G$, a reset gate voltage $V_{RG}$ of about 1V or less may be applied to the reset gate electrode 133, and a reset drain voltage $V_{D2}$ of about 0V or less may be applied to the reset drain region 125. Accordingly, holes stored in the charge pocket region 111 doped with the p-type impurities may be discharged through the reset drain region 125.

During a charge integration operation, the power supply voltage Vdd of about 2.8V to 3.3V may be applied as a drain voltage $V_{D1}$, a gate voltage $V_G$ of 0V may be applied to allow the pixel transistor to be turned off, and the power supply voltage Vdd may be applied as a source voltage $V_S$. A reset gate voltage $V_{RG}$ of about 1V or more may be applied to the reset gate electrode 133, and a reset drain voltage $V_{D2}$ of about 0V or less may be applied to the reset drain region 125. Under this voltage condition, the pixel transistor and the reset transistor may be turned off, and holes generated by photons incident on the semiconductor substrate may be accumulated in the charge pocket region 111. The holes stored in the charge pocket region 111 may reduce the threshold voltage of the pixel transistor.

Subsequently, a readout operation of reading a voltage or current output from the unit pixel through the source region 121 may be performed.

For example, a gate voltage $V_G$ greater than or equal to the threshold voltage (e.g., about 0.5V) may be applied to allow the pixel transistor to be turned on, and the power supply voltage Vdd may be applied to the drain voltage $V_{D1}$. A reset gate voltage $V_{RG}$ of about 1V or more may be applied to the reset gate electrode 133, and the reset drain voltage $V_{D2}$ of about 0V or less may be applied to the reset drain region 125. Under this voltage condition, the source voltage $V_S$ output from the source region 121 may be increased by the reduced threshold voltage, and a difference in voltages output from the source voltage $V_S$ before and after the charge integration operation may be detected, thereby counting photons incident on the semiconductor substrate.

Figure 16:
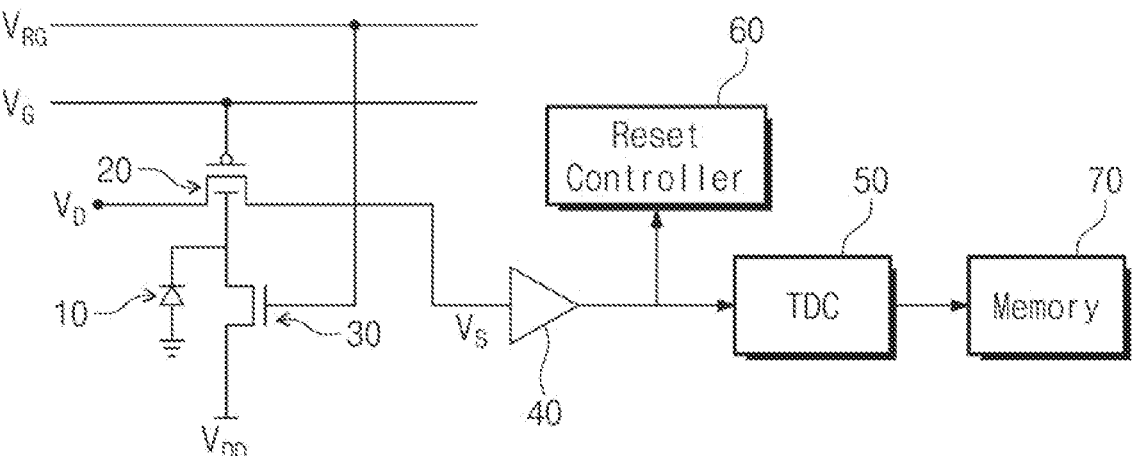
FIGS. 16, 17, and 18 are schematic circuit diagrams of image sensors according to an embodiment.
Figure 17:
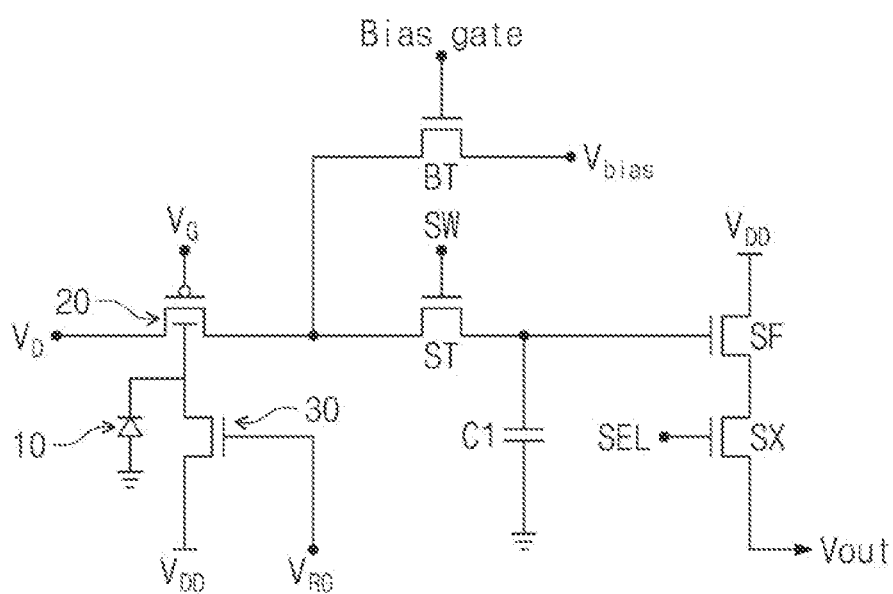
Figure 18:
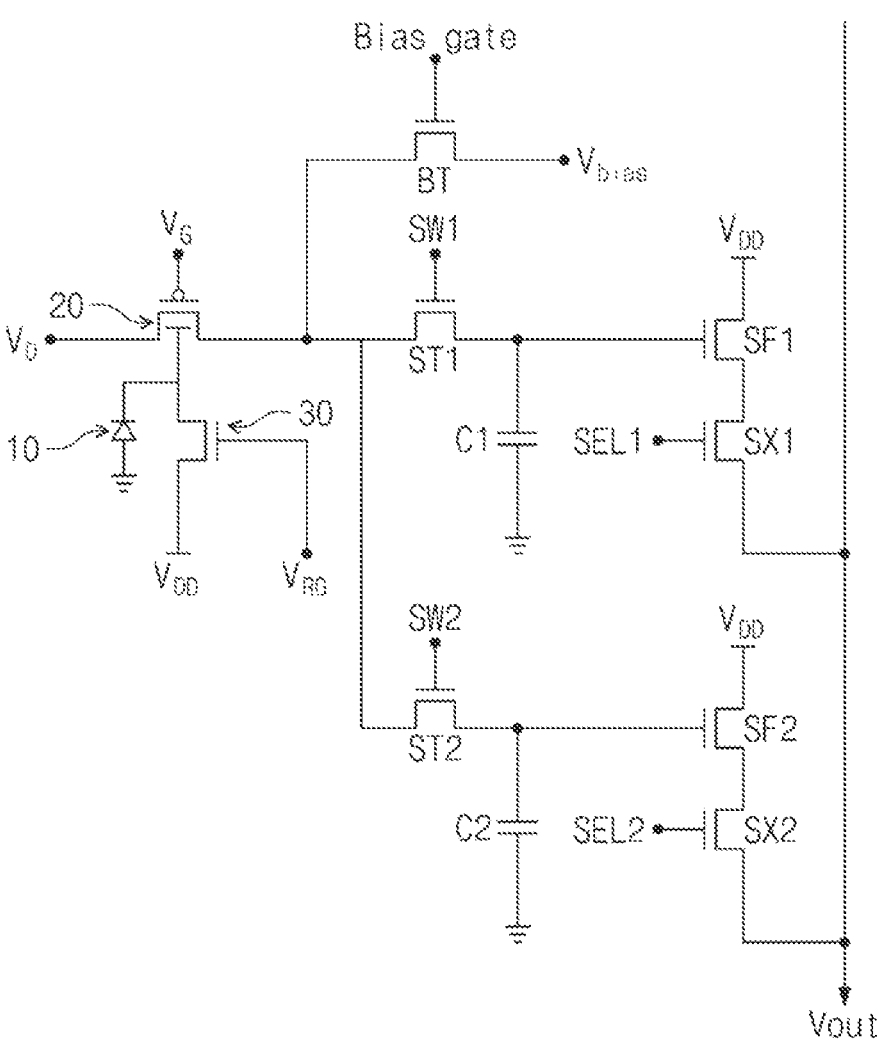

FIGS. 16, 17, and 18 are schematic circuit diagrams of image sensors according to embodiments.

Referring to FIG. 16, an image sensor may include a photodetector 10, a pixel transistor 20, a reset transistor 30, a comparator 40, a time-to-digital converter (TDC) 50, a reset controller 60, and a memory 70.

The photodetector 10 may include a photodiode, as described above.

In the pixel transistor 20, the amount of current flowing through a channel or a threshold voltage may vary depending on the amount of charges generated (or accumulated) by the photodetector 10.

The reset transistor 30 may discharge charges stored in the photodetector 10 depending on a reset gate voltage $V_{RG}$.

The comparator 40 compares a pixel signal output from the unit pixel (e.g., the source of the pixel transistor 20) with a reference voltage and outputs the comparison.

The signal output from the comparator 40 may store time data in the memory 70 in response to the time when the signal is generated by a single photon by the TDC 50. The TDC 50 may calculate a time from when the light source is irradiated to an object until the reflected light is detected and store the time in the memory 70. A signal output from the comparator 40 may be transmitted to the reset controller 60 to control the reset timing of the unit pixel.

According to embodiments, in the image sensor, a reset operation in a state in which the pixel transistor 20 is turned-off, a charge integration operation, and a readout operation in a state in which the pixel transistor 20 is turned-on may be sequentially performed, and accordingly, photons incident on the unit pixel may be counted.

As another example, the image sensor may proceed in an order of a reset operation in a state in which the pixel transistor 20 is turned off and a readout operation in a state in which the pixel transistor 20 is turned on. Accordingly, a direct TOF operation in which information about an incident time of a photon is preserved may be performed.

Furthermore, the image sensor may separately measure and store a signal in a dark state, and may improve accuracy by removing the dark signal from the measurement signal.

Referring to FIG. 17, an image sensor may include a photodetector 10, a pixel transistor 20, a reset transistor 30, a bias transistor BT, a switching transistor ST, a capacitor C1, a source follower transistor SF, and a selection transistor SX.

Charges generated by the current induced by photon may be accumulated in the capacitor C1. When the current continuously flows in the unit pixel, the amount of charge accumulated in the capacitor C1 may vary as the current changes when the photocharge is generated. As this operation is repeated, a pixel signal may be output through the source follower transistor SF in proportion to the amount of charge of the capacitor C1.

Referring to FIG. 18, an image sensor may include a photodetector 10, a pixel transistor 20, a reset transistor 30, a bias transistor BT, and first and second switching transistors ST1 and ST2, first and second capacitors C1 and C2, first and second source follower transistors SF1 and SF2, and first and second selection transistors SX1 and SX2. Here, the reset transistor 30 may be omitted, and as described with reference to FIG. 4, the unit pixel may include one photodetector 10 and one pixel transistor 20.

According to this embodiment, the first capacitor C1 may store charges generated by a current induced by a photon, and the second capacitor C2 may store charges generated in a dark state. In embodiments, the amount of charge stored in the second capacitor C2 may be used as intensity reference information.

Figure 19:
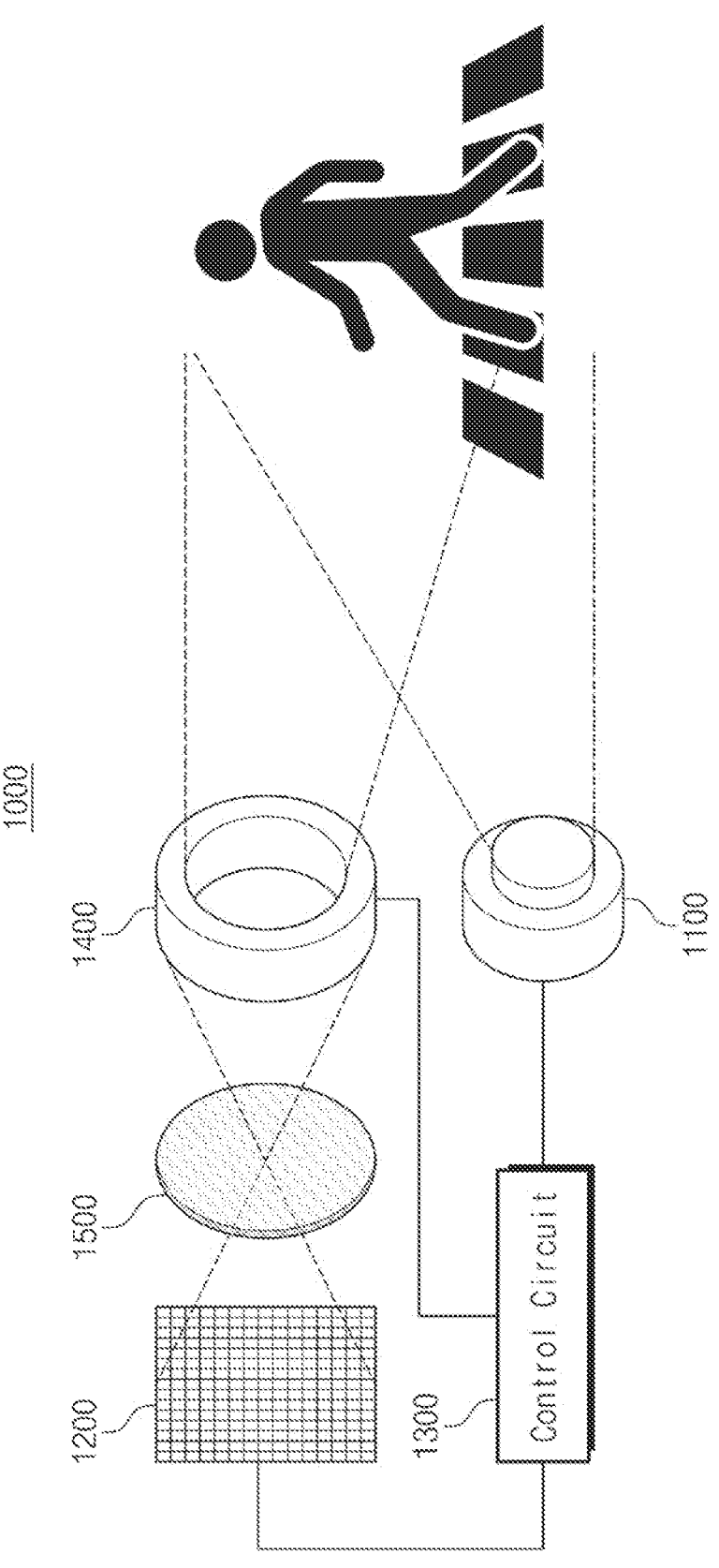
FIG. 19 is a diagram schematically illustrating an image sensor system according to an embodiment.

FIG. 19 is a diagram schematically illustrating an image sensor system according to embodiments.

Referring to FIG. 19, an image sensor system 1000 may include a light source 1100 for irradiating light to a target object 500, an image sensor 1200 for detecting the light reflected from the object 500, a control circuit 1300, and an image amplifier 1400. The light source 1100, the image sensor 1200, and the control circuit 1300 are substantially the same as those described with reference to FIG. 1, and a description thereof will be omitted.

When measuring a depth of the distant object 500, intensity of reflected pulses may be reduced, and the image amplifier 1400 may be configured to amplify the light reflected from the object 500 and allow the amplified reflected pulse to be detected at the image sensor 1200. The image amplifier 1400 may be controlled by the control circuit 1300.

Furthermore, the image sensor system 1000 may further include a lens module 1500 between the image sensor 1200 and the image amplifier 1400. The lens module 1500 may focus the amplified reflected pulse and provide it to the image sensor 1200.

According to embodiments, the single photon may be counted under the low voltage condition, and it may be advantageous to reduce the size of the unit pixel. Accordingly, the low-illuminance performance may be improved, and it is possible to reduce the size of the TOF sensor.

While example embodiments have been particularly shown and described, it will be understood by one of ordinary skill in the art that variations in form and detail may be made therein without departing from the spirit and scope of the attached claims.

What is claimed is:

1. An image sensor comprising:
a semiconductor substrate comprising a pixel region;
a vertical gate electrode disposed in the semiconductor substrate at a center of the pixel region;
a charge pocket region provided under the vertical gate electrode in the semiconductor substrate, and doped with a first impurity having a first conductivity type;
a first impurity region which is spaced apart from the charge pocket region in a vertical direction, doped with a second impurity having a second conductivity type, and surrounded by the vertical gate electrode; and
a second impurity region which is provided around the vertical gate electrode and doped with the second impurity,
wherein the vertical gate electrode has a closed loop shape and surrounds the first impurity region when viewed in a plan view.

2. The image sensor of claim 1, wherein a width of the charge pocket region is smaller than a width of the vertical gate electrode.

3. The image sensor of claim 1, further comprising a channel impurity region which is provided along a bottom surface of the vertical gate electrode and a side surface of the vertical gate electrode, and disposed between the first impurity region and the second impurity region,
wherein the channel impurity region is doped with the second impurity.

4. The image sensor of claim 1, further comprising a charge collection region which is provided around the charge pocket region and doped with the first impurity,
wherein a concentration of the first impurity in the charge collection region is lower than a concentration of the first impurity in the charge pocket region.

5. The image sensor of claim 1, wherein the second impurity region surrounds the vertical gate electrode from a perspective of the plan view.

6. The image sensor of claim 1, further comprising:
a reset gate electrode which is spaced apart from the vertical gate electrode from a perspective of the plan view and disposed in the semiconductor substrate; and
a reset drain impurity region which is spaced apart from the second impurity region, doped with the first impurity in the semiconductor substrate, and disposed at one side of the reset gate electrode.

7. The image sensor of claim 6, wherein the charge pocket region extends from a first location underneath the vertical gate electrode to a second location underneath the reset gate electrode.

8. The image sensor of claim 1, further comprising a pixel isolation structure which passes through the semiconductor substrate in the vertical direction and defines the pixel region,
wherein the pixel isolation structure surrounds the pixel region from a perspective of the plan view, and
wherein the pixel isolation structure comprises a conductive pattern which passes through the semiconductor substrate in the vertical direction, and a liner insulating pattern interposed between the conductive pattern and the semiconductor substrate.

* * * * *